(12) United States Patent
Wojtecki et al.

(10) Patent No.: US 12,476,144 B2
(45) Date of Patent: Nov. 18, 2025

(54) ETCH BACK AND FILM PROFILE SHAPING OF SELECTIVE DIELECTRIC DEPOSITION

(71) Applicant: International Business Machines Corporation, Armonk, NY (US)

(72) Inventors: Rudy J. Wojtecki, San Jose, CA (US); Son Nguyen, Schenectady, NY (US); Balasubramanian S. Pranatharthiharan, Santa Clara, CA (US); Cornelius Brown Peethala, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 833 days.

(21) Appl. No.: 17/544,337

(22) Filed: Dec. 7, 2021

(65) Prior Publication Data
US 2023/0178432 A1    Jun. 8, 2023

(51) Int. Cl.
*H01L 21/768* (2006.01)
*H01L 23/522* (2006.01)

(52) U.S. Cl.
CPC .. *H01L 21/76897* (2013.01); *H01L 21/76831* (2013.01); *H01L 21/76879* (2013.01); *H01L 23/5226* (2013.01)

(58) Field of Classification Search
CPC ......... H01L 21/76897; H01L 21/76831; H01L 21/76879; H01L 21/28562; H01L 23/5226; H01L 23/5283
See application file for complete search history.

(56) References Cited

U.S. PATENT DOCUMENTS

| | | | |
|---|---|---|---|
| 6,784,492 B1 * | 8/2004 | Morishita | H10D 30/60 257/E29.055 |
| 7,728,436 B2 | 6/2010 | Whelan et al. | |
| 7,799,698 B2 | 9/2010 | Zhang et al. | |

(Continued)

FOREIGN PATENT DOCUMENTS

WO   WO2016178978 A1   11/2016
WO   WO2017192980 A1   11/2017

OTHER PUBLICATIONS

Seongjae Kim et al., "Self-Assembled Monolayers: Versatile Uses in Electronic Devices from Gate Dielectrics, Dopants, and Biosensing Linkers," Micromachines 2021, 12, 565 (May 2021) (17 pages).

(Continued)

*Primary Examiner* — Zandra V Smith
*Assistant Examiner* — John M Parker
(74) *Attorney, Agent, or Firm* — Aaron N. Pontikos

(57) ABSTRACT

Self-aligned semiconductor device structures and techniques for fabrication thereof are provided. In one aspect, a self-aligned semiconductor device structure includes: at least one first conductive element embedded in a first dielectric; a second dielectric disposed selectively on the first dielectric relative to the at least one first conductive element; and at least one second conductive element present in the second dielectric that is fully aligned with the at least one first conductive element. A liner can be disposed on the second dielectric and which separates the second dielectric from the at least one second conductive element. A method of forming a self-aligned semiconductor device structure is also provided.

8 Claims, 8 Drawing Sheets

(56) References Cited

U.S. PATENT DOCUMENTS

| | | | |
|---|---|---|---|
| 8,232,176 | B2 | 7/2012 | Lubomirsky et al. |
| 8,435,901 | B2 | 5/2013 | Zin |
| 10,229,927 | B2 * | 3/2019 | Lee ................ H10D 30/693 |
| 10,378,105 | B2 | 8/2019 | Yu et al. |
| 10,692,755 | B2 | 6/2020 | Shobha et al. |
| 10,777,411 | B1 * | 9/2020 | Nguyen ............ H01L 21/02118 |
| 11,011,413 | B2 * | 5/2021 | Wang ................ H01L 21/76847 |
| 11,171,054 | B2 | 11/2021 | Nguyen et al. |
| 2004/0061191 | A1 * | 4/2004 | Paton ................ H10D 30/6739 |
| | | | 257/E21.409 |
| 2007/0298585 | A1 | 12/2007 | Lubomirsky et al. |
| 2008/0009141 | A1 | 1/2008 | Dubois et al. |
| 2011/0306214 | A1 | 12/2011 | Zin |
| 2015/0311151 | A1 * | 10/2015 | Chi ................ H01L 21/7682 |
| | | | 438/653 |
| 2017/0342553 | A1 | 11/2017 | Yu et al. |
| 2018/0308858 | A1 * | 10/2018 | Hopkins ................ H10B 41/27 |
| 2019/0207009 | A1 * | 7/2019 | Yamaguchi .......... H10D 30/701 |
| 2019/0311985 | A1 * | 10/2019 | Maniscalco ....... H01L 21/76823 |
| 2020/0152736 | A1 * | 5/2020 | Yu ........................ H10D 84/0158 |
| 2021/0005548 | A1 * | 1/2021 | Lee ................ H01L 23/5226 |
| 2021/0098400 | A1 * | 4/2021 | Shen ................ H01L 24/13 |
| 2021/0336043 | A1 * | 10/2021 | Birner ................ H10D 64/111 |
| 2022/0052055 | A1 * | 2/2022 | Chun ................ H10B 12/485 |
| 2022/0230956 | A1 * | 7/2022 | Noh ................ H01L 21/76883 |
| 2023/0238236 | A1 | 7/2023 | Peethala et al. |

OTHER PUBLICATIONS

Fatemeh Sadat Minaye Hashemi, "Area Selective Atomic Layer Deposition of Metal Oxides on Metal-Dielectric Patterns," A Dissertation Submitted to the Department of Materials Science and Engineering and the Committee on Graduate Studies of Stanford University (Aug. 2016) (66 pages).

Mameli et al., "Area-Selective Atomic Layer Deposition of SiO2 Using Acetylacetone as a Chemoselective Inhibitor in an ABC-Type Cycle," ACS Nano, 11, 9303-9311 (Aug. 2017).

Lei Guo, "Selective Chemistry of Metal Oxide Atomic Layer Deposition on Si Based Substrate Surfaces," Dissertation, University of California Riverside (Mar. 2015) (30 pages).

Grill et al., "Progress in the development and understanding of advanced low k and ultralow k dielectrics for very large-scale integrated interconnects—State of the art," Applied Physics Reviews 1, 011306 (Jan. 2014) (18 pages).

Briggs et al., "Process Challenges in Fully Aligned Via Integration for sub 32 nm Pitch BEOL," 2018 IEEE International Interconnect Technology Conference (IITC), Abstract (Jun. 2018) (3 pages).

Jang et al., "Plasma Induced Damage Reduction of Ultra Low-k Dielectric by Using Source Pulsed Plasma Etching for Next BEOL Interconnect Manufacturing," IEEE Transactions on Semiconductor Manufacturing, vol. 33, No. 2, pp. 302-309 (May 2020).

Jun Ki Ahn et al., "Vapor-phase deposition-based self-assembled monolayer for an electrochemical sensing platform," AIP Advances 10, 045213 (Apr. 2020) (7 pages).

\* cited by examiner (follows from FIG. 11)

ETCH BACK AND FILM PROFILE SHAPING OF SELECTIVE DIELECTRIC DEPOSITION

FIELD OF THE INVENTION

The present invention relates to semiconductor device structures, and more particularly, to self-aligned semiconductor device structures and techniques for fabrication thereof by the deposition of a low-κ dielectric selectively on dielectrics with etch back and film profile shaping.

BACKGROUND OF THE INVENTION

The formation of middle-of-line (MOL) and back-end-of-line (BEOL) semiconductor device structures such as interconnects typically involves blanket depositing an interlayer dielectric (ILD) over a conductive element, e.g., a metal line or metal pad, and the surrounding dielectric. A lithographic process is then used to pattern features such as vias and/or trenches in the ILD over the metal line or metal pad. The features are then filled with a conductor to form the interconnects.

However, with this standard process, care must be taken to precisely land the features on the metal line or metal pad. Namely, any misalignment of the interconnects with the underlying metal line or metal pad can undesirably lead to a decreased contact area and thus increased contact resistance. With scaled device dimensions and tighter pitches, the alignment of the interconnects to the underlying metal becomes even more challenging to control by lithography.

Accordingly, improved, self-aligning techniques for MOL and BEOL semiconductor device fabrication would be desirable.

SUMMARY OF THE INVENTION

The present invention provides self-aligned semiconductor device structures and techniques for fabrication thereof by the deposition of a low-κdielectric selectively on dielectrics with etch back and film profile shaping. In one aspect of the invention, a self-aligned semiconductor device structure is provided. The self-aligned semiconductor device structure includes: at least one first conductive element embedded in a first dielectric; a second dielectric disposed selectively on the first dielectric relative to the at least one first conductive element; and at least one second conductive element present in the second dielectric that is fully aligned with the at least one first conductive element.

In another aspect of the invention, another self-aligned semiconductor device structure is provided. The self-aligned semiconductor device structure includes: at least one first conductive element embedded in a first dielectric; a second dielectric disposed selectively on the first dielectric relative to the at least one first conductive element; at least one second conductive element present in the second dielectric that is fully aligned with the at least one first conductive element; and a liner disposed on the second dielectric and which separates the second dielectric from the at least one second conductive element.

In yet another aspect of the invention, a method of forming a self-aligned semiconductor device structure is provided. The method includes: forming at least one first conductive element embedded in a first dielectric; selectively forming at least one first self-assembled monolayer (SAM) on the at least one first conductive element; depositing a second dielectric onto the first dielectric, wherein the at least one first SAM suppresses deposition of the second dielectric onto the at least one first conductive element; patterning the second dielectric over the at least one first SAM; and selectively removing the at least one first SAM to reveal at least one feature having sidewalls that are tapered present in the second dielectric and fully aligned with the at least one first conductive element.

A more complete understanding of the present invention, as well as further features and advantages of the present invention, will be obtained by reference to the following detailed description and drawings.

DETAILED DESCRIPTION OF PREFERRED EMBODIMENTS

Figure 1:
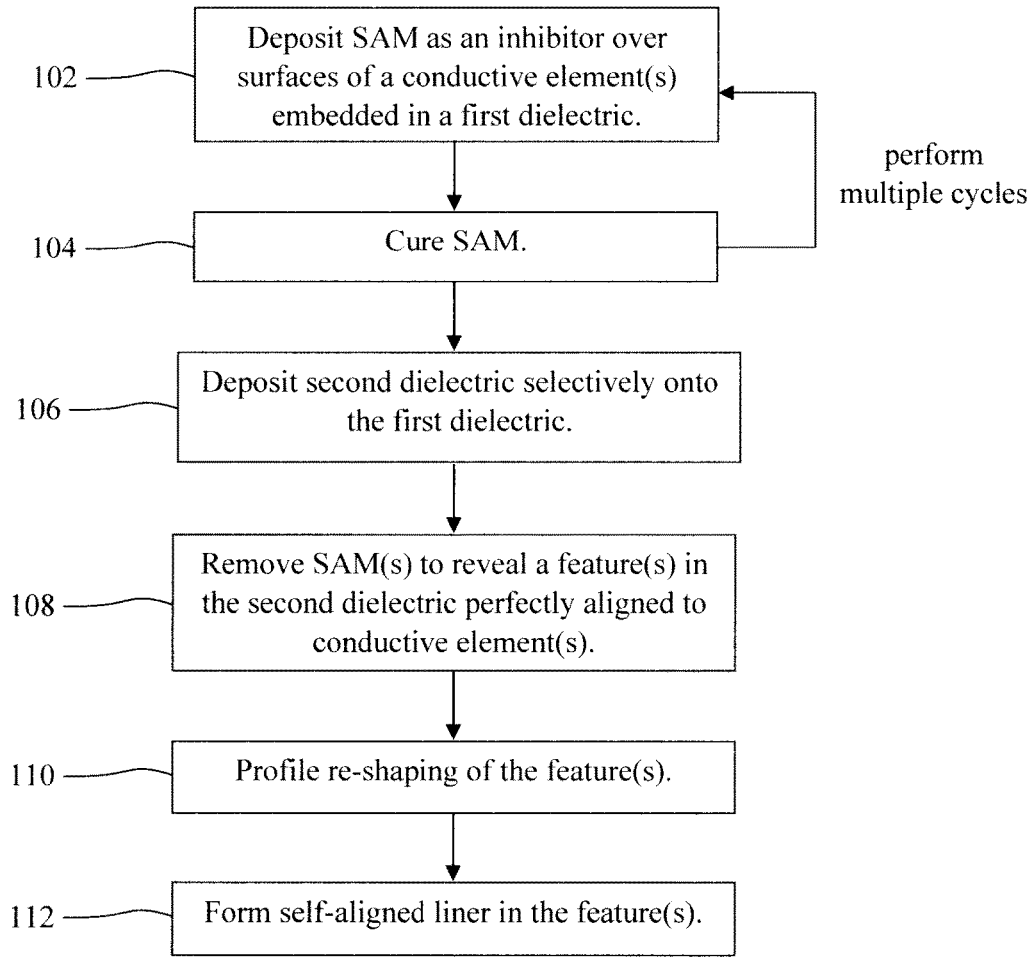
FIG. 1 is a diagram illustrating an exemplary methodology for forming a self-aligned semiconductor device structure according to an embodiment of the present invention.

As provided above, standard lithography-based techniques for middle-of-line (MOL) and back-end-of-line (BEOL) semiconductor device fabrication can incur some misalignment of structures such as interconnects with the underlying metal undesirably leading to a decrease in contact area and thus an increase in contact resistance. Misalignment is an even greater concern for devices at scaled dimensions and tighter pitches.

In general, MOL and BEOL semiconductor device structures such as interconnects are formed over conductive structures such as metal lines and/or metal pads embedded in a dielectric layer. To do so, an interlayer dielectric (ILD) is deposited onto this layer, and the interconnects are formed in the ILD. Suitable ILD materials include, but are not limited to, low-κ dielectric materials such as SiOx, organosilicate glass (SiCOH), carbon-rich silicon carbon nitride (SiCN) and/or silicon carbon nitride oxide (SiCNO) and/or ultralow-κ interlayer dielectric (ULK-ILD) materials, e.g., having a dielectric constant κ of less than or equal to 2.7. By comparison, silicon dioxide ($SiO_2$) has a dielectric constant κ value of 3.9. Suitable ultralow-κ dielectric materials include, but are not limited to, porous organosilicate glass (pSiCOH), porous silicon carbonitride (pSiCN) and/or porous SiCNO (pSiCNO).

Leveraging a self-aligned process for interconnect fabrication where the ILD is selectively deposited on the underlying dielectric relative to the metal lines and/or metal pads ideally can lead to the formation of interconnects that are precisely aligned to the metal lines and/or metal pads, even at an aggressively scaled pitch. Namely, the notion here is that placing the ILD only on the underlying dielectric leaves only the surfaces of the metal lines and/or metal pads exposed during the metal fill, thereby resulting in a perfectly aligned interconnect placement.

However, the task of depositing a low-κ dielectric such as an ILD selectively on dielectrics presents some notable challenges. For instance, a self-assembled monolayer (SAM) such as a dyine-reinforced polymer like polynorbornene (PNB) can be configured for preferential deposition onto metal surfaces such as the metal lines and/or metal pads as opposed to surfaces of the surrounding dielectric. Once deposited onto the metal lines and/or metal pads, the SAM serves to modify the surface energy properties of the metal lines and/or metal pads to which the SAM is grafted. A process such as chemical vapor deposition (CVD), plasma enhanced chemical vapor deposition (PECVD), atomic layer deposition (ALD) or physical vapor deposition (PVD) can then be employed to deposit the ILD during which the SAM will suppress deposition of the ILD onto the metal lines and/or metal pads (due to the surface energy property modification by the SAM). However, with these processes, the ILD growth occurs rapidly with the ILD quickly covering over the SAM. If the SAM is covered over, the benefits of self-alignment for the subsequent structures is lost.

Advantageously, provided herein are techniques for suppressing this lateral growth of low-κ dielectric over the SAM, thereby enabling the effective formation of a low-κ dielectric selectively over dielectrics. Namely, the present techniques employ long chain surface SAMs that are bonded to the metal lines and/or metal pads along with a (thermal and ultraviolet (UV)) cross-linking process to produce stable, thicker SAMs with vertical cross-linking bonding. Further, this process can be repeated through multiple cyclic grafting, growth, and curing cycles to increase the thickness of the SAM. Lateral growth of low-κ dielectric is effectively suppressed by this SAM inhibitor, forming a feature in the ILD that is precisely aligned to the metal lines and/or metal pads. Following deposition of the ILD an etch back and profile shaping of the ILD can be employed to create different types of unique feature characteristics, such as features having a vertical, tapered and/or bowed profiles by wet etching, or plasma or reaction ion etching. Further, following the profile shaping a SAM can again be bonded to the metal lines and/or metal pads to place a subsequent etch stop layer for preventing damage to the underlying ILD. Each of these features of the present techniques will be described in detail below.

An overview of the present techniques is now provided by way of reference to exemplary methodology 100 of FIG. 1 for forming a self-aligned semiconductor device structure. The process begins with at least one conductive element such as a metal lines and/or metal pads embedded in a (first) dielectric, and in step 102 a SAM is deposited selectively on the surfaces of the conductive elements. To look at it another way, the SAM is not present on the surfaces of the first dielectric. Suitable materials for the first dielectric include, but are not limited to, oxide interlayer dielectric (ILD)

materials such as SiOx, SiCOH, carbon-rich SiCN and/or SiCNO and/or ULK-ILD materials such as pSiCOH, pSiCN and/or pSiCNO. This is notable, since the present techniques will enable the deposition/growth of a second (e.g., low-κ ILD) selectively on the first dielectric.

According to an exemplary embodiment, the SAM is selectively deposited onto the metal surfaces of the conductive elements using a vapor phase SAM deposition process, whereby the surfaces for SAM deposition (in this case the metal lines and/or metal pads embedded in the first dielectric) are contacted with a SAM-containing vapor. Advantageously, by comparison with a liquid-phase approach, a vapor phase SAM deposition process is solvent-free which will advantageously enable cyclic SAM grafting to form multiple levels of SAMs on the metal surfaces.

Suitable materials for the conductive elements include, but are not limited to, metals such as copper (Cu), tungsten (W), cobalt (Co) and/or ruthenium (Ru) and/or combined metal alloys such as copper manganese (CuMn) and/or copper aluminum (CuAl). As highlighted above, the SAM is configured for preferential deposition onto metal surfaces such as that of the conductive elements. Namely, a SAM molecule can generally be thought of as having a head group for selective binding to a surface (in this case the surfaces of the conductive elements), an end group for modifying the surface energy properties of the surface to which the SAM is grafted (in this case to suppress deposition of a second dielectric onto the surfaces of the conductive elements), and a spacer group interconnecting the head group and the end group (e.g., an alkyl carbon chain). See, for example, Seongjae Kim et al., "Self-Assembled Monolayers: Versatile Uses in Electronic Devices from Gate Dielectrics, Dopants, and Biosensing Linkers," Micromachines 2021, 12, 565 (May 2021) (17 pages). Suitable head groups include, but are not limited to, thiol, silane, alkene, alkanoic acid and/or phosphonic acid groups. For instance, by way of example only, a thiol or phosphonic acid head group can be employed in the present SAMs to provide an affinity for binding to metal surfaces such as the surfaces of the conductive elements relative to the surface of the first dielectric. Suitable end groups include, but are not limited to, amine, methyl, alkene, alkyne and/or thiol groups.

Figure 2:
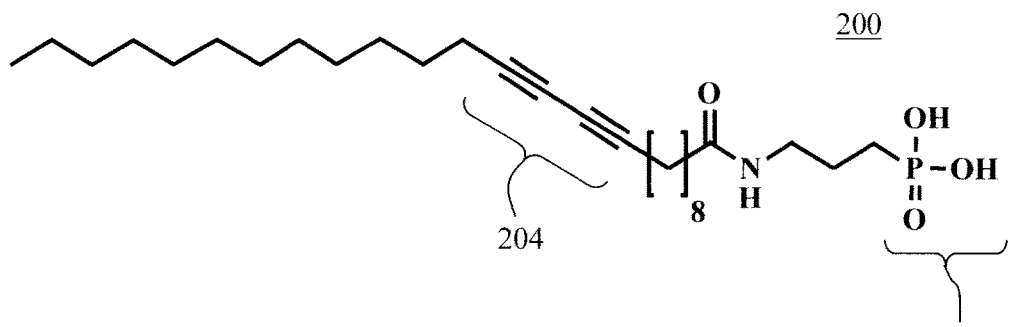
FIG. 2 is a diagram illustrating an exemplary self-assembled monolayer (SAM) molecule according to an embodiment of the present invention.

Referring briefly to FIG. 2, an exemplary SAM molecule 200 is shown that may be employed in accordance with the present techniques. As shown in FIG. 2, SAM molecule 200 has a (in this case phosphonic acid) head group 202, and a photoactive dyine 204. As will be described in detail below, the presence of the photoactive dyine 204 enables cross-linking bonding by thermal and UV cure to form a stable and thicker vertically cross-linked SAM to inhibit lateral growth of the low-κ dielectric more effectively over the SAM.

Namely, referring to FIG. 1, in step 104 the SAM that was deposited on the metal surfaces of the conductive elements in step 102 is then cured. According to an exemplary embodiment, a thermal and/or ultraviolet (UV) cure of the SAM is performed in step 104. For instance, by way of example only, the SAM is exposed to UV light while being heated to a temperature of from about 200 degrees Celsius (° C.) to about 300° C. and ranges therebetween. Heating the SAM and exposing it to UV light serves to cross-link the polymer. As highlighted above, the (cured) SAM modifies the surface energy properties of the metal surfaces of the conductive elements to which the SAM is grafted, thereby inhibiting deposition of a second dielectric that will be deposited (selectively) onto the first dielectric (see below).

For instance, by way of example only, the SAM can include alkene or alkyne end groups, where the end group interfaces with the air.

In one exemplary, non-limiting example, a single level of SAM is formed on the metal surfaces of the conductive elements, and in step 106 a second dielectric is deposited selectively on the first dielectric based on the presence of the SAM inhibiting growth of the second dielectric on the metal surfaces of the conductive elements. Suitable materials for the second dielectric include, but are not limited to, low-κ dielectric materials such as SiOx, SiCOH, carbon-rich SiCN and/or SiCNO and/or ULK-ILD materials such as pSiCOH, pSiCN and/or pSiCNO. According to an exemplary embodiment, the second dielectric is deposited using a CVD process such as flowable CVD which provides good gap fill properties and self-planarization.

Figure 3:
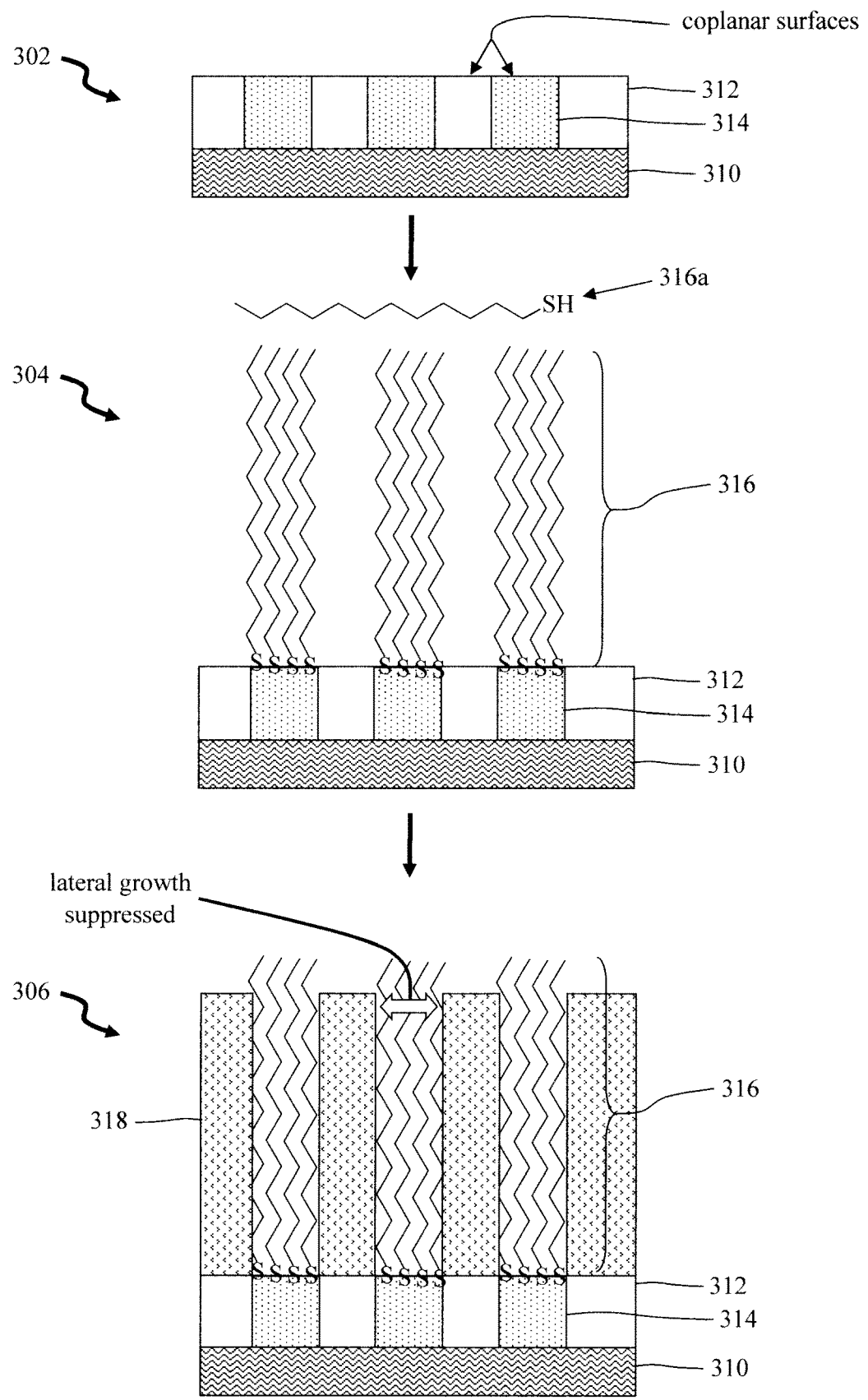
FIG. 3 is a diagram illustrating an exemplary methodology for use of a SAM for selective dielectric-on-dielectric deposition according to an embodiment of the present invention.

Referring briefly to methodology 300 of FIG. 3, a schematic illustration of this process of using a single level of SAM to enable selective dielectric-on-dielectric deposition is provided. As shown in FIG. 3, the process begins with the deposition of a dielectric 312 on a substrate 310, and the formation of at least one conductive element 314 in the dielectric 312. See step 302. According to an exemplary embodiment, the substrate 310 is a bulk semiconductor wafer, such as a bulk silicon (Si), bulk germanium (Ge), bulk silicon germanium (SiGe) and/or bulk III-V semiconductor wafer. Alternatively, substrate 310 can be a semiconductor-on-insulator (SOI) wafer. A SOI wafer includes a SOI layer separated from an underlying substrate by a buried insulator. When the buried insulator is an oxide it is referred to herein as a buried oxide or BOX. The SOI layer can include any suitable semiconductor, such as Si, Ge, SiGe, and/or a III-V semiconductor. Substrate 310 may already have pre-built structures (not shown) such as transistors, diodes, capacitors, resistors, interconnects, wiring, etc.

Suitable materials for the dielectric 312 include, but are not limited to, low-κ dielectric materials such as SiOx, SiCOH, carbon-rich SiCN and/or SiCNO and/or ULK-ILD materials such as pSiCOH, pSiCN and/or pSiCNO, which can be deposited onto the substrate 310 using a process such as CVD, ALD or PVD. Following deposition, the dielectric 312 can be planarized using a process such as chemical mechanical polishing (CMP).

Standard lithography and etching techniques are then employed to pattern features (e.g., trenches and/or vias) in the dielectric 312, which are then filled with a metal or combination of metals to form the conductive elements 314, e.g., metal lines and/or metal pads, embedded in the dielectric 312. It is notable that while multiple conductive elements 314 are shown in FIG. 3, embodiments are contemplated herein where more (or fewer) conductive elements 314 are implemented than shown, including embodiments where only a single conductive element 314 is employed.

With standard lithography and etching techniques, a lithographic stack (not shown), e.g., photoresist/anti-reflective coating (ARC)/organic planarizing layer (OPL), is used to pattern a hard-mask (not shown) with the footprint and location of the features to be patterned. Alternatively, the hard-mask can be formed by other suitable techniques, including but not limited to, sidewall image transfer (SIT), self-aligned double patterning (SADP), self-aligned quadruple patterning (SAQP), and other self-aligned multiple patterning (SAMP). An etch is then used to transfer the pattern from the hard-mask to the underlying dielectric 312 to form the features (e.g., trenches and/or vias) in the dielectric 312. A directional (anisotropic) etching process such as reactive ion etching (RIE) can be employed for the feature etch.

Suitable metals for the conductive elements 314 include, but are not limited to, Cu, W, Co and/or Ru and/or alloys such as CuMn and/or CuAl, which can be deposited using a process such as evaporation, sputtering or electrochemical plating. Following deposition, the metal overburden can be removed using a process such as CMP or grinding. As a result, the top surfaces of the dielectric 312 are coplanar with the top surfaces of the conductive elements 314. However, the goal is to deposit another dielectric (see below) on only the exposed (top) surfaces of the dielectric 312, and not on the exposed (top) surfaces of the conductive elements 314. To do so, a SAM 316 is selectively formed on the exposed surfaces of the conductive elements 314 relative to the exposed surfaces of the dielectric 312. See step 304. In other words, the SAM 316 is not present on (i.e., is absent from) the exposed surfaces of the dielectric 312. In this example, the SAM 316 is selectively deposited onto the exposed surfaces of the conductive elements 314 using a vapor phase deposition process, whereby the surfaces for SAM deposition (in this case the exposed surfaces of the conductive elements 314 embedded in the dielectric 312) are contacted with the SAM that is in a vapor phase 316a.

The SAM 316 is configured for preferential deposition onto the exposed surfaces of the conductive elements 314. For instance, as shown in FIG. 3, the SAM 316 can include a thiol head group to provide an affinity for biding to the exposed (metal) surfaces of the conductive elements 314 relative to the surface of the dielectric 312. Following deposition of the SAM 316 selectively on the surfaces of the conductive elements 314, the SAM is preferably cured. According to an exemplary embodiment, the curing is performed by exposing the SAM 316 to UV light while being heated to a temperature of from about 200° C. to about 300° C. and ranges therebetween, which serves to cross-link the polymer. The (cured) SAM 316 serves to modify the surface energy properties of the conductive elements 314, thereby inhibiting deposition of a subsequent dielectric onto the conductive elements 314.

Namely, a dielectric 318 is then deposited onto the substrate 310 over the dielectric 312 and conductive elements 314. See step 306. For clarity, the terms 'first' and 'second' may also be used herein when referring to dielectric 312 and dielectric 318, respectively. Suitable materials for the dielectric 318 include, but are not limited to, low-κ dielectric materials such as SiOx, SiCOH, carbon-rich SiCN and/or SiCNO and/or ULK-ILD materials such as pSiCOH, pSiCN and/or pSiCNO. According to an exemplary embodiment, the dielectric 318 is deposited using a process such as flowable CVD. It is notable, however, that other plasma and thermal CVD/ALD methods can also be used to deposit the dielectric 318.

Due to the presence of the SAM 316 inhibitor on the surfaces of the conductive elements 314, deposition of the dielectric 318 onto the surfaces of the conductive elements 314 is suppressed. As a result, by this process the ILD 318 is advantageously deposited selectively onto the dielectric 312. Further, as shown in FIG. 3, the cross-linked SAM 316 provides a tall, robust barrier to lateral growth of the ILD 318 over the conductive elements 314.

Referring back to methodology 100 of FIG. 1 it is seen that, optionally, multiple cycles of the selective deposition of SAM (step 102) and SAM curing (step 104) can instead be performed to increase the thickness of the SAM inhibitor on the conductive elements, thereby further suppressing lateral growth of the second dielectric. Namely, rapid growth of the second dielectric in step 106 can cause the second dielectric to exceed the height of the SAM, thus burying the underlying conductive elements. Thus, by adding one or more additional layers of SAM to increase the height of the SAM over the conductive elements, the chances of this lateral growth from occurring can be further reduced.

Figure 4:
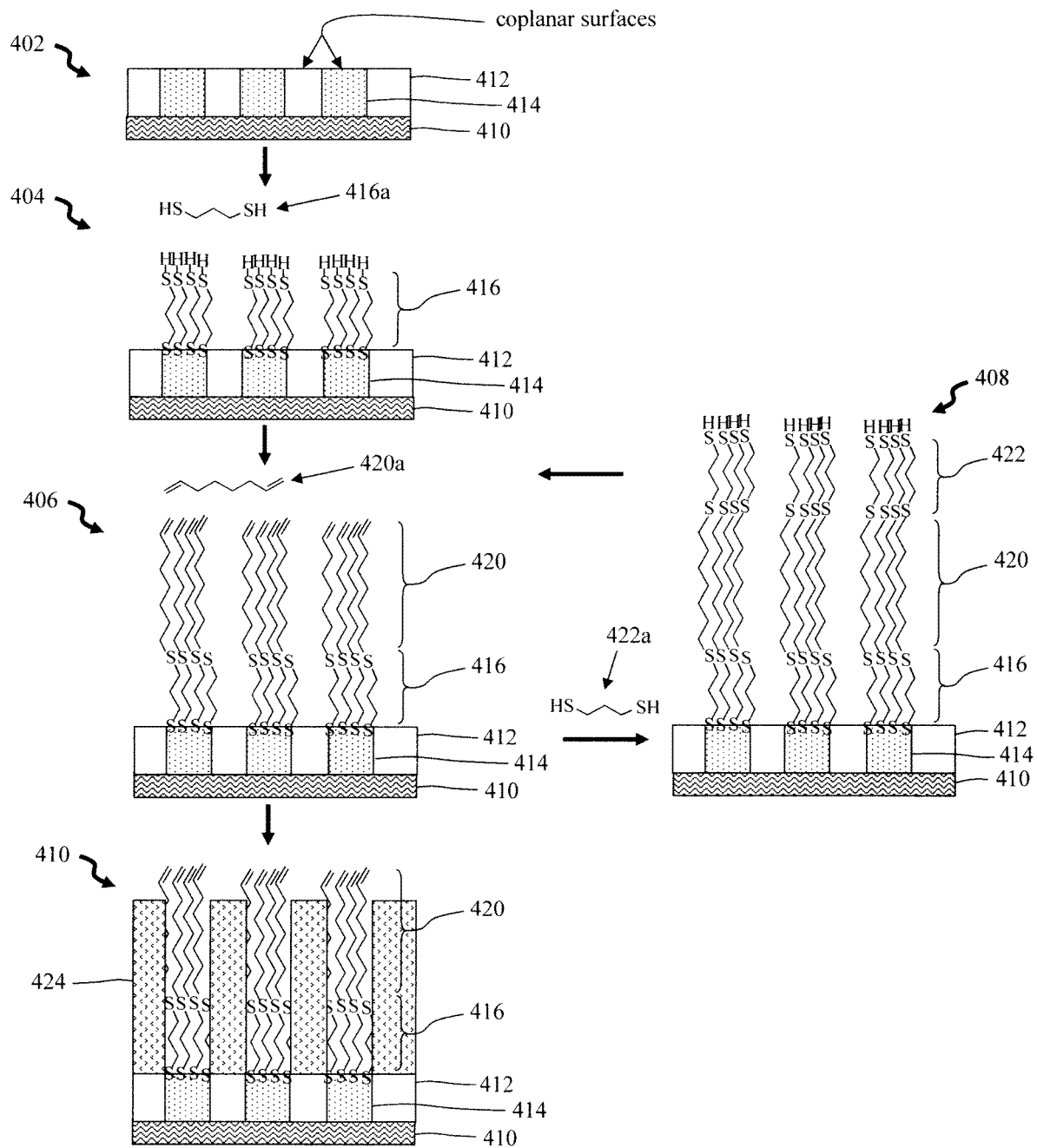
FIG. 4 is a diagram illustrating an exemplary methodology for use of a cyclic SAM process for selective dielectric-on-dielectric deposition according to an embodiment of the present invention.

Referring briefly to methodology 400 of FIG. 4, a schematic illustration of cyclic SAM deposition is provided. As shown in FIG. 4, the process begins with the deposition of a dielectric 412 on a substrate 410, and the formation of at least one conductive element 414 in the dielectric 412. See step 402. As in the preceding example, the substrate 410 can be a bulk semiconductor (e.g., Si, Ge, SiGe and/or III-V) wafer or SOI wafer, suitable materials for the dielectric 412 include, but are not limited to, low-κ dielectric materials such as SiOx, SiCOH, carbon-rich SiCN and/or SiCNO and/or ULK-ILD materials such as pSiCOH, pSiCN and/or pSiCNO, and suitable materials for the conductive elements 414 include, but are not limited to, metals such as Cu, W, Co and/or Ru. A process for forming the conductive elements 414 in the dielectric 412 was described above. As shown in FIG. 4, the top surfaces of the dielectric 412 are coplanar with the top surfaces of the conductive elements 414.

A (first) SAM 416 is then selectively formed on the exposed surfaces of the conductive elements 414 relative to the exposed surfaces of the dielectric 412. See step 404. In other words, the first SAM 416 is not present on (i.e., is absent from) the exposed surfaces of the dielectric 412. In this example, the first SAM 416 is selectively deposited onto the exposed surfaces of the conductive elements 414 using a vapor phase deposition process, whereby the surfaces for SAM deposition (in this case the exposed surfaces of the conductive elements 414 embedded in the dielectric 412) are contacted with the SAM that is in a vapor phase 416a.

The first SAM 416 is configured for preferential deposition onto the exposed surfaces of the conductive elements 414. For instance, by way of example only, the first SAM 416 can include a thiol head group to provide an affinity for binding to the exposed (metal) surfaces of the conductive elements 414 relative to the surface of the dielectric 412. The first SAM 416 can also include a thiol end group for grafting the next SAM layer (see below). Following deposition of the first SAM 416 selectively on the surfaces of the conductive elements 414, a thermal/UV cure of the first SAM 416 (e.g., by exposing the first SAM 416 to UV light at a temperature of from about 200° C. to about 300° C. and ranges therebetween) is performed which serves to cross-link the polymer. This UV exposure will also initiate a radical reaction with a vapor phase SAM 420a to form a second SAM 420 selectively on the first SAM 416. See step 406.

According to an exemplary embodiment, the second SAM 420 includes an alkene head group that will bind to the thiol end group of the first SAM 416 via a thiol-ene reaction. As shown in FIG. 4, the length of the spacer group interconnecting the head group and the end group can differ amongst the first SAM 416, second SAM 420, etc. For instance, by way of example only, a longer chain is used in the second SAM 420, which serves to further increase the height of the SAM inhibitor over the conductive elements 414, as compared to using two SAMs 416 of equal length.

One or more additional grafting, growth, and curing cycles can be performed, if so desired, to increase the height of the SAM inhibitor over the conductive elements 414. For instance, following deposition of the second SAM 420, a thermal/UV cure of the second SAM 420 is performed (as described above) which serves to cross-link the polymer.

This UV exposure will also initiate a radical reaction with a vapor phase SAM 422a to form a third SAM 422 selectively on the second SAM 420. See step 408. In this particular example, the third SAM 422 includes a thiol head group that will bind to the alkene end group of the second SAM 420 in a via a thiol-ene reaction. It is notable that the depiction of the formation of three levels of SAMs, i.e., first SAM 416, second SAM 420, and third SAM 422, over the conductive elements 414 is merely an example and embodiments are considered herein where more (or fewer) SAM layers are formed than shown, including embodiments where (as in the previous example) only a single SAM is formed over the conductive elements 414.

Following deposition of the first, second, third, etc. SAMs 416, 420, 422, etc., a dielectric 424 is then deposited onto the substrate 410 over the dielectric 412 and conductive elements 414. See step 410. For clarity, the terms 'first' and 'second' may also be used herein when referring to dielectric 412 and dielectric 424, respectively. Suitable materials for the dielectric 424 include, but are not limited to, low-κ dielectric materials such as SiOx, SiCOH, carbon-rich SiCN and/or SiCNO and/or ULK-ILD materials such as pSiCOH, pSiCN and/or pSiCNO. According to an exemplary embodiment, the dielectric 424 is deposited using a process such as flowable CVD. It is notable, however, that other plasma and thermal CVD/ALD methods can also be used to deposit the dielectric 424.

Due to the presence of the first, second, third, etc. SAMs 416, 420, 422, etc., on the surfaces of the conductive elements 414, deposition of the dielectric 424 onto the surfaces of the conductive elements 414 is suppressed. As a result, by this process the dielectric 424 is advantageously deposited selectively onto the dielectric 412, and the cross-linked first, second, third, etc. SAMs 416, 420, 422, etc., provide a tall, robust barrier to lateral growth of the ILD 424 over the conductive elements 414.

Referring back to methodology 100 of FIG. 1, the SAM (or multiple levels of SAM) is then selectively removed, revealing features (e.g., a trench and/or via) in the second dielectric over the conductive elements. Advantageously, since the SAM(s) was selectively deposited onto the surfaces of the conductive elements, the features formed by removal of the SAM(s) will be perfectly aligned to the conductive elements. Namely, the features formed by this process are present over an entire surface of each of the conductive elements, and only over the conductive elements. To look at it another way, the features will not be present (i.e., the features are absent) over the first dielectric. An etch process such as reactive ion etching (RIE), a wet chemical etch, or a gas phase etch can be employed to selectively remove the SAM from the features.

The features formed by removal of the SAM(s) will have vertical sidewalls. However, as shown in step 110, etch back and film profile shaping of the features can next be performed to configure the shape of the features. For instance, as will be described in detail below, an etch can be performed to create features having tapered or bowed sidewalls. Namely, in one exemplary implementation of the present techniques, the features are later filled with a metal(s) to form MOL or BEOL interconnect structures. Advantageously, creating tapered or bowed sidewalls increases the size of the features in which these interconnects are formed (as compared to those having vertical sidewalls), thereby reducing resistance. Notably, the features remain perfectly aligned to the conductive elements throughout the shaping process.

In step 112, an optional liner is deposited into the features. Among other things, the liner can serve to protect the underlying dielectric during subsequent processing steps. For instance, by way of example only, if interconnects are later formed in the features, then liner can serve as an etch stop layer during metal etch-back and/or polishing. Suitable materials for the liner include, but are not limited to, metal oxides such as aluminum oxide ($Al_2O_3$), zinc oxide (ZnO) and/or titanium oxide ($TiO_2$), which can be deposited using a process such as CVD, ALD or PVD. According to an exemplary embodiment, the liner has a thickness of from about 1 nanometer (nm) to about 5 nm and ranges therebetween.

Advantageously, a unique process is presented herein for self-aligning the liner within the features. Namely, as will be described in detail below, another SAM is deposited selectively onto the conductive elements within the (optionally shaped) features, which will inhibit growth of the liner on the surfaces of the conductive elements. Thus, the liner will form only on the exposed surfaces of the second dielectric. To look at it another way, the liner formed by this unique process will be perfectly aligned to the conductive elements.

Figure 5:
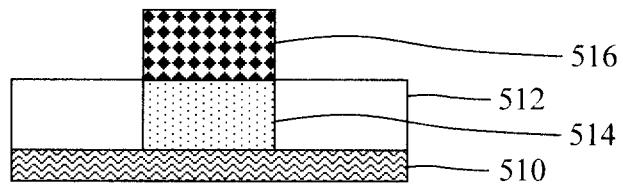
FIG. 5 is a diagram illustrating, according to an exemplary implementation of the present techniques, a (first) dielectric having been deposited on a substrate, at least one (first) conductive element having been formed in the first dielectric, and at least one (first) SAM having been selectively formed on the exposed surfaces of the first conductive element(s) according to an embodiment of the present invention.

Given the above overview, an exemplary methodology for forming a self-aligned semiconductor device structure in accordance with the present techniques is now described by way of reference to FIGS. 5-9. As shown in FIG. 5, the process begins in the same general manner as the preceding examples with the deposition of a dielectric 512 on a substrate 510, and the formation of at least one conductive element 514 (e.g., a metal line and/or a metal pad) in the dielectric 512. As in the preceding examples, the substrate 510 can be a bulk semiconductor (e.g., Si, Ge, SiGe and/or III-V) wafer or SOI wafer, suitable materials for the dielectric 512 include, but are not limited to, low-κ dielectric materials such as SiOx, SiCOH, carbon-rich SiCN and/or SiCNO and/or ULK-ILD materials such as pSiCOH, pSiCN and/or pSiCNO, and suitable materials for the conductive element(s) 514 include, but are not limited to, metals such as Cu, W, Co and/or Ru. A process for forming the conductive element(s) 514 in the dielectric 512 was described above. The top surfaces of the dielectric 512 are coplanar with the top surface of the conductive element(s) 514.

At least one level of SAM 516 is then selectively formed on the exposed surfaces of the conductive element(s) 514 relative to the exposed surfaces of the dielectric 512. In other words, the SAM(s) 516 is not present on (i.e., is absent from) the exposed surfaces of the dielectric 512. In the same manner as described above, the SAM(s) 516 can include a single or multiple, vertically stacked, levels of SAM (any of which is generically represented by structure 516 in the figures. As described above, the SAM(s) 516 is configured to bind selectively to the surfaces of the conductive element(s) 514 and to suppress dielectric growth on the surfaces of the conductive element(s) 514, as well as lateral growth over the conductive element(s) 514. According to an exemplary embodiment, the SAM(s) 516 is deposited onto the conductive element(s) 514 using a vapor phase deposition process (see above).

Figure 6:
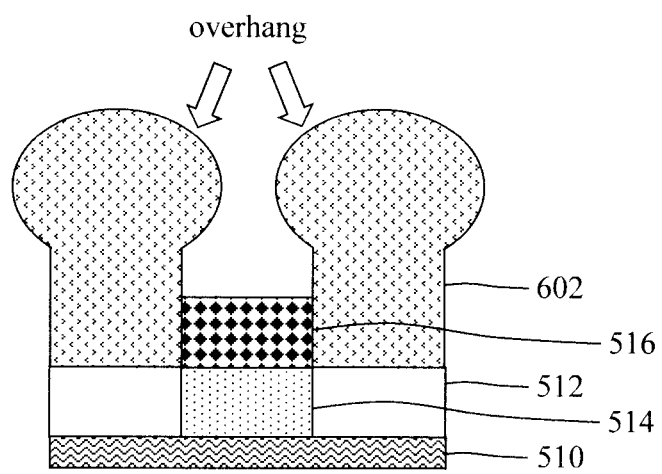
FIG. 6 is a diagram illustrating a (second) dielectric having been deposited onto the substrate over the first dielectric and first conductive element(s) with some overhang of the second dielectric forming above the first conductive element(s) according to an embodiment of the present invention.

Next, as shown in FIG. 6, a dielectric 602 is deposited onto the substrate 510 over the dielectric 512 and conductive element(s) 514. For clarity, the terms 'first' and 'second' may also be used herein when referring to dielectric 512 and dielectric 602, respectively. Suitable materials for the dielectric 602 include, but are not limited to, low-κ dielectric materials such as SiOx, SiCOH, carbon-rich SiCN and/or SiCNO and/or ULK-ILD materials such as pSiCOH, pSiCN and/or pSiCNO. According to an exemplary embodiment, the dielectric 602 is deposited using a process such as flowable CVD which, as provided above, offers good gap fill properties and self-planarization.

Figure 7:
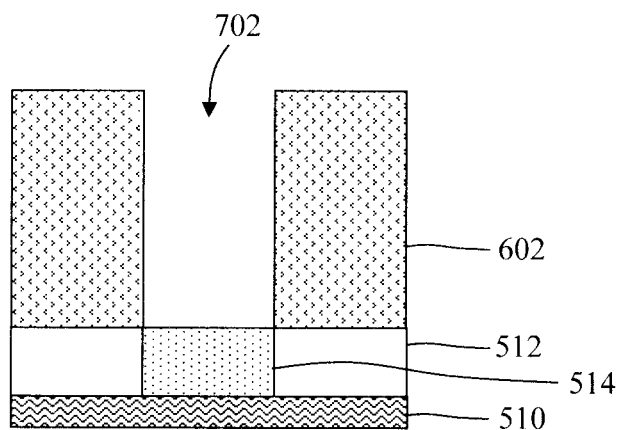
FIG. 7 is a diagram illustrating an etch-back having been performed to remove the overhang, and the first SAM(s) having been removed to reveal at least one feature(s) in the second dielectric according to an embodiment of the present invention.
Figure 8:
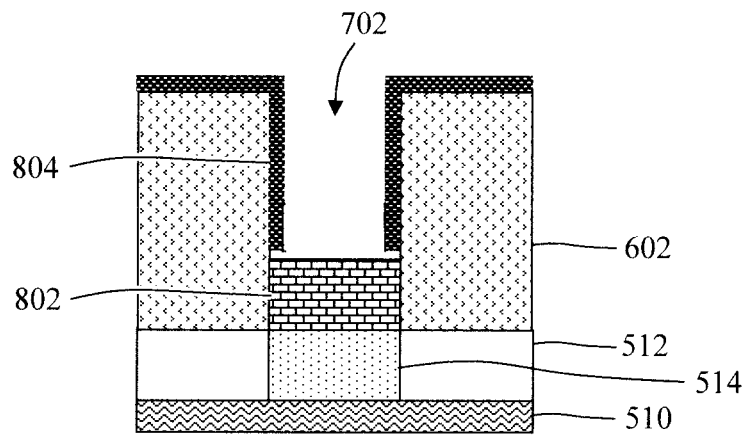
FIG. 8 is a diagram illustrating at least one (second) SAM having been selectively formed on the exposed surfaces of the second conductive element(s) within the feature(s), and a liner having been deposited onto the second dielectric and into, and lining, the feature(s), whereby the second SAM(s) suppresses growth of the liner on the second conductive element(s) according to an embodiment of the present invention.

While the SAM(s) 516 helps to control lateral growth of the dielectric 602, as described above deposition of the dielectric 602 can occur quickly thereby resulting in some overhang of the dielectric 602 above the conductive element(s) 514. However, a subsequent etch-back of the dielectric 602 easily and effectively removes this overhang. Namely, as shown in FIG. 7, an etch-back has been performed to remove the dielectric 602 overhang. A directional (i.e., anisotropic) etching process such as RIE can be employed for the etch-back. What remains of the SAM(s) 516 can also be removed using a follow-up RIE, wet chemical or gas phase etching process, to reveal at least one feature 702 (e.g., a trench and/or via) in the dielectric 602. In this particular example, the feature(s) 702 produced has vertical sidewalls. However, in the examples below, a shaping process will be employed to produce features having, e.g., tapered or bowed sidewalls.

Advantageously, since the SAM(s) 516 was selectively deposited onto the surfaces of the conductive element(s) 514, the feature(s) 702 formed by removal of the SAM(s) 516 will be fully aligned to the conductive element(s) 514. Namely, as shown in FIG. 7, the feature(s) 702 formed by this process cover an entire surface of the conductive element(s) 514, and only the conductive element(s) 514. To look at it another way, the feature(s) 702 are not be present (i.e., the feature(s) 702 are absent) over the dielectric 512.

According to an exemplary embodiment, the present techniques are employed to form MOL and/or BEOL semiconductor device structures such as interconnects. In that regard, the feature(s) 702 can then simply be filled with a metal or combination of metals to form an interconnect(s) that is perfectly aligned with the conductive element(s) 514. However, the dielectric 602 is susceptible to damage during subsequent processing, including those steps involved in interconnect metallization.

Thus, according to an exemplary embodiment, a self-aligned liner is next formed in the feature(s) 702 to protect the underlying dielectric 602. To do so, at least one level of SAM 802 is next selectively formed on the exposed surfaces of the conductive element(s) 514 within the feature(s) 702. See FIG. 8. For clarity, the terms 'first' and 'second' may also be used herein when referring to SAM(s) 516 and SAM(s) 802, respectively. In the same manner as described above, the SAM(s) 802 can include a single or multiple, vertically stacked, levels of SAM (any of which is generically represented by structure 802 in the figures). As highlighted above, the SAM(s) 802 is configured to bind selectively to the surfaces of the conductive element(s) 514 and to suppress growth of the liner on the surfaces of the conductive element(s) 514, thereby enabling the formation of a self-aligned liner. For instance, by way of example only, a SAM with a high carbon content will suppress growth of the liner on the surfaces of the conductive element(s) 514. According to an exemplary embodiment, the SAM(s) 802 is deposited onto the conductive element(s) 514 in the feature(s) 702 using a vapor phase deposition process (see above).

A liner 804 is then deposited onto the dielectric 602 and into, and lining, the feature(s) 702. Suitable liner materials include, but are not limited to, metal oxides such as $Al_2O_3$, ZnO and/or $TiO_2$, which can be deposited using a process such as CVD, ALD or PVD. According to an exemplary embodiment, the liner 804 has a thickness of from about 1 nm to about 5 nm and ranges therebetween. Advantageously, due to the presence of the SAM(s) 802 as an inhibitor on the conductive element(s) 514 in the feature(s) 702, growth of the liner 804 on the conductive element(s) 514 will be suppressed. Thus, the liner 804 will not form on (i.e., will be absent from) the surfaces of the conductive element(s) 514. Forming the liner 804 in this manner is referred to herein as a 'self-aligning' process. By way of example only, eliminating the liner 804 from the surfaces of the conductive element(s) 514 will enable the formation of structures such as interconnects in the feature(s) 702 that directly contact the conductive element(s) 514, thereby vastly reducing overall contact resistance.

Figure 9:
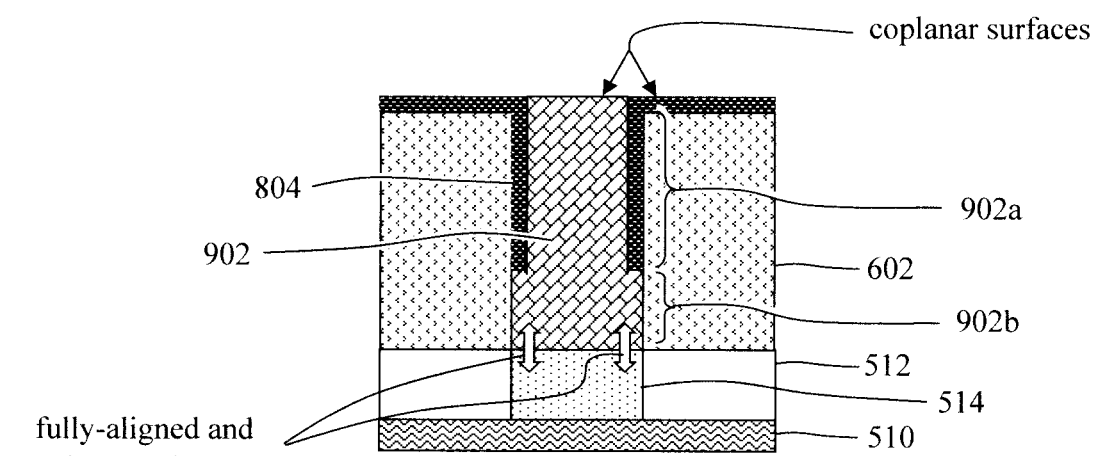
FIG. 9 is a diagram illustrating the second SAM(s) having been selectively removed, and a metal(s) having been deposited into the feature(s) over the liner to form at least one (second) conductive element in the second dielectric over the first conductive element(s) according to an embodiment of the present invention.

Namely, as shown in FIG. 9, the SAM(s) 802 is then selectively removed, and a metal (or combinations of metals) is deposited into the feature(s) 702 over the liner 804 to form a conductive element(s) 902 (such as an interconnect) in the dielectric 602 over the conductive element(s) 514. For clarity, the terms 'first' and 'second' may also be used herein when referring to the conductive element(s) 514 and the conductive element(s) 902.

An etch process such as RIE, a wet chemical etch, or a gas phase etch can be employed to selectively remove the SAM(s) 802 from the feature(s) 702. Suitable metals for the conductive element(s) 902 include, but are not limited to, Cu, W, Co and/or Ru, which can be deposited into the feature(s) 702 using a process such as evaporation, sputtering or electrochemical plating. Following deposition, the metal overburden can be removed using a process such as CMP or grinding. Advantageously, the liner 804 serves as an etch stop during this metal removal process, thereby protecting the underlying dielectric 602. According to an exemplary embodiment, a top surface of the conductive element(s) 902 is now coplanar with a top surface of the liner 804.

Since the (self-aligned) liner 804 is not present on the conductive element(s) 514, the conductive element(s) 902 formed in this manner directly contacts the underlying conductive element(s) 514. The direct metal-to-metal contact between the conductive element(s) 514 and the conductive element(s) 902 greatly reduces the contact resistance through these structures. Further, as shown in FIG. 9, the present process to place the liner 804 results in a unique configuration where the liner 804 partially covers the sidewall of the conductive element(s) 902. Namely, the liner 804 is present along only an upper portion 902a of the conductive element(s) 902 (i.e., separating the upper portion 902a of the conductive element(s) 902 from the dielectric 602). The liner 804 is absent from a lower portion 902b of the conductive element(s) 902 (i.e., such that the lower portion 902b of the conductive element(s) 902 directly contact the dielectric 602).

Advantageously, the present process results in the formation of the conductive element(s) 902 that are fully aligned to the underlying conductive element(s) 514. By 'fully aligned' it is meant that, at a juncture of the conductive element(s) 902 with the conductive element(s) 514, both (opposing) sidewalls of the conductive element(s) 902 are aligned with those of the conductive element(s) 514. To look at it another way, the conductive element(s) 902 and the conductive element(s) 514 have a continuous sidewall. Thus, any problems associated with the misalignment of these structures (such as decreased contact area/increased contact resistance) are avoided altogether.

Figure 10:
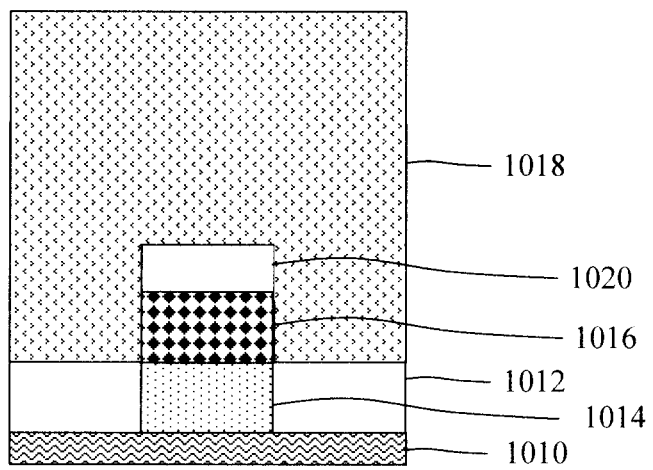
FIG. 10 is a diagram illustrating, according to another exemplary implementation of the present techniques, a (first) dielectric having been deposited on a substrate, at least one (first) conductive element having been formed in the first dielectric, at least one (first) SAM having been selectively formed on the exposed surfaces of the first conductive element(s), and a second dielectric having been deposited onto the substrate over the first dielectric 1012 and covering the first conductive element(s) according to an embodiment of the present invention.

In the present example, the conductive element(s) 902 has vertical sidewalls. However, as provided above, embodiments are also contemplated herein where a profile shaping of the features is performed which serves to configure the shape of the resulting conductive element(s). For instance, an exemplary methodology for forming a self-aligned semiconductor device structure with profile shaping in accordance with the present techniques is now described by way of reference to FIGS. 10-13. As shown in FIG. 10, the process begins in the same general manner as the preceding examples with the deposition of a dielectric 1012 on a substrate 1010, and the formation of at least one conductive element 1014 (e.g., a metal line and/or a metal pad) in the dielectric 1012. As in the preceding examples, the substrate 1010 can be a bulk semiconductor (e.g., Si, Ge, SiGe and/or III-V) wafer or SOI wafer, suitable materials for the dielectric 1012 include, but are not limited to, low-κ dielectric materials such as SiOx, SiCOH, carbon-rich SiCN and/or SiCNO and/or ULK-ILD materials such as pSiCOH, pSiCN and/or pSiCNO, and suitable materials for the conductive element(s) 1014 include, but are not limited to, metals such as Cu, W, Co and/or Ru. A process for forming the conductive element(s) 1014 in the dielectric 1012 was described above. The top surfaces of the dielectric 1012 are coplanar with the top surface of the conductive element(s) 1014.

At least one level of SAM 1016 is then selectively formed on the exposed surfaces of the conductive element(s) 1014 relative to the exposed surfaces of the dielectric 1012. In other words, the SAM(s) 1016 is not present on (i.e., is absent from) the exposed surfaces of the dielectric 1012. In the same manner as described above, the SAM(s) 1016 can include a single or multiple, vertically stacked, levels of SAM (any of which is generically represented by structure 1016 in the figures. As described above, the SAM(s) 1016 is configured to bind selectively to the surfaces of the conductive element(s) 1014 and to suppress dielectric growth on the surfaces of the conductive element(s) 1014, as well as lateral growth over the conductive element(s) 1014. According to an exemplary embodiment, the SAM(s) 1016 is deposited onto the conductive element(s) 1014 using a vapor phase deposition process (see above).

Next, a dielectric 1018 is deposited onto the substrate 1010 over the dielectric 1012 and conductive element(s) 1014. For clarity, the terms 'first' and 'second' may also be used herein when referring to dielectric 1012 and dielectric 1018, respectively. Suitable materials for the dielectric 1018 include, but are not limited to, low-κ dielectric materials such as SiOx, SiCOH, carbon-rich SiCN and/or SiCNO and/or ULK-ILD materials such as pSiCOH, pSiCN and/or pSiCNO. According to an exemplary embodiment, the dielectric 1018 is deposited using a process such as flowable CVD which, as provided above, offers good gap fill properties and self-planarization.

While the SAM(s) 1016 helps to control lateral growth of the dielectric 1018 over the conductive element(s) 1014, build-up of the dielectric 1018 over the conductive element(s) 1014 can occur quickly and, if permitted to accumulate will eventually cover over the conductive element(s) 1014. In this particular example, some build-up of the dielectric 1018 over the conductive element(s) 1014 in this manner is desirable since a subsequent etching process will be employed to open and shape the features. Notably, the presence of the SAM(s) 1016 suppresses deposition of the dielectric 1018 directly over the conductive element(s) 1014 thereby creating a gap 1020 in the dielectric 1018 directly over the conductive element(s) 1014.

Figure 11:
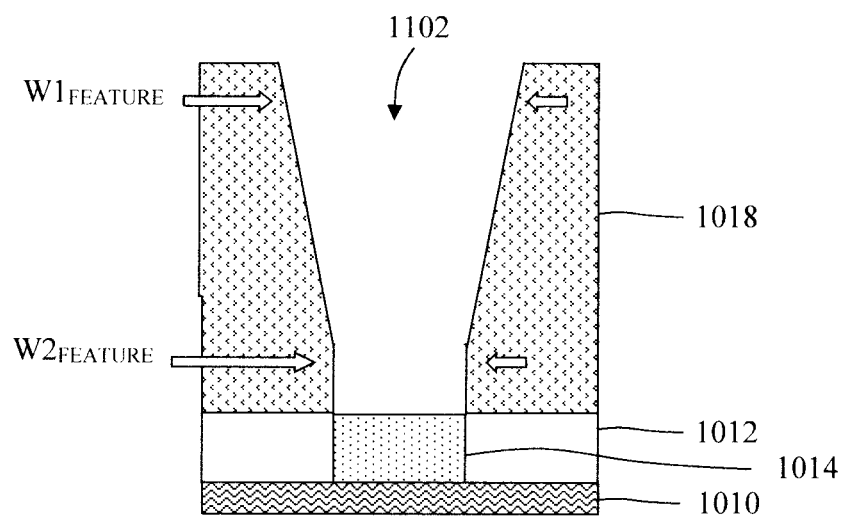
FIG. 11 is a diagram illustrating a directional etching process having been used to pattern the second dielectric, and the first SAM(s) having been removed to reveal at least one feature in the second dielectric over the first conductive element(s) having tapered sidewalls according to an embodiment of the present invention.
Figure 12:
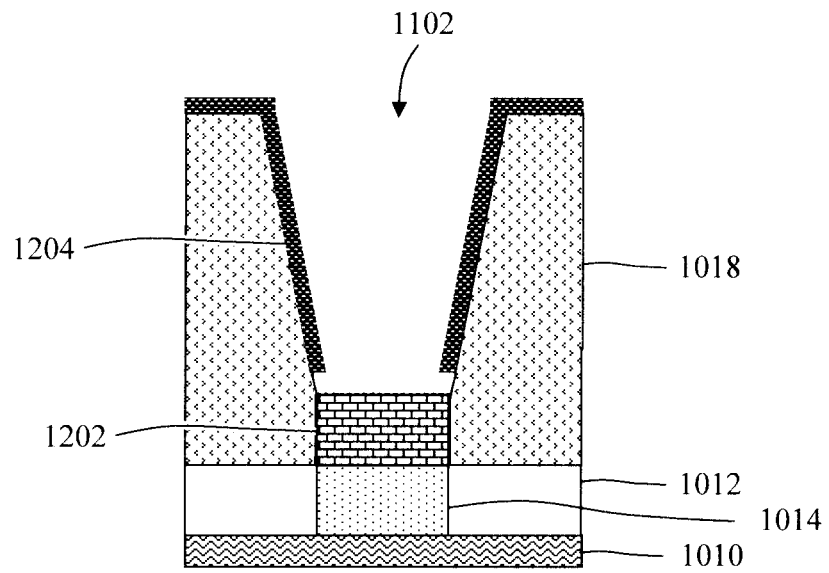
FIG. 12 is a diagram illustrating at least one second SAM having been selectively formed on the exposed surfaces of the first conductive element(s) within the feature(s), and a liner having been deposited onto the second dielectric and into, and lining, the feature(s) whereby the second SAM(s) suppresses growth of the liner on the second conductive element(s) according to an embodiment of the present invention.

As shown in FIG. 11, a directional (i.e., anisotropic) etching process such as RIE is then employed to pattern the dielectric 1018 over the gap 1020/SAM(s) 1016. What remains of the SAM(s) 1016 can also be removed using a follow-up RIE, wet chemical or gas phase etching process, to reveal at least one feature 1102 in the dielectric 1018 over the conductive element(s) 1014. In this particular example, the feature(s) 1102 has tapered sidewalls such that a top of the feature(s) 1102 has a width $W1_{FEATURE}$ and a bottom of the feature(s) 1102 has a width $W2_{FEATURE}$, whereby $W1_{FEATURE}$ is greater than $W2_{FEATURE}$, i.e., $W1_{FEATURE} > W2_{FEATURE}$.

Advantageously, since the SAM(s) 1016 was selectively deposited onto the surfaces of the conductive element(s) 1014, the feature(s) 1102 formed by removal of the SAM(s) 1016 will be fully-aligned to the conductive element(s) 1014. Namely, as shown in FIG. 11, the feature(s) 1102 formed by this process cover an entire surface of the conductive element(s) 1014, and only the conductive element(s) 1014. To look at it another way, the feature(s) 1102 are not be present (i.e., the feature(s) 1102 are absent) over the dielectric 1012.

According to an exemplary embodiment, the present techniques are employed to form MOL and/or BEOL semiconductor device structures such as interconnects. In that regard, the feature(s) 1102 can then simply be filled with a metal or combination of metals to form an interconnect(s) that is perfectly aligned with the conductive element(s) 1014. However, the dielectric 1018 is susceptible to damage during subsequent processing, including those steps involved in interconnect metallization.

Thus, according to an exemplary embodiment, a self-aligned liner is next formed in the feature(s) 1102 to protect the underlying dielectric 1018. To do so, at least one level of SAM 1202 is next selectively formed on the exposed surfaces of the conductive element(s) 1014 within the feature(s) 1102. See FIG. 12. For clarity, the terms 'first' and 'second' may also be used herein when referring to SAM(s) 1016 and SAM(s) 1202, respectively. In the same manner as described above, the SAM(s) 1202 can include a single or multiple, vertically stacked, levels of SAM (any of which is generically represented by structure 1202 in the figures). As highlighted above, the SAM(s) 1202 is configured to bind selectively to the surfaces of the conductive element(s) 1014 and to suppress growth of the liner on the surfaces of the conductive element(s) 1014, thereby enabling the formation of a self-aligned liner. For instance, by way of example only, a SAM with a high carbon content will suppress growth of the liner on the surfaces of the conductive element(s) 1014. According to an exemplary embodiment, the SAM(s) 1202 is deposited onto the conductive element(s) 1014 in the feature(s) 1102 using a vapor phase deposition process (see above).

A liner 1204 is then deposited onto the dielectric 1018 and into, and lining, the feature(s) 1102. As provided above, suitable liner materials include, but are not limited to, metal oxides such as $Al_2O_3$, ZnO and/or $TiO_2$, which can be deposited using a process such as CVD, ALD or PVD. According to an exemplary embodiment, the liner 1204 has a thickness of from about 1 nm to about 5 nm and ranges therebetween. Advantageously, due to the presence of the SAM(s) 1202 as an inhibitor on the conductive element(s) 1014 in the feature(s) 1102, growth of the liner 1204 on the conductive element(s) 1014 will be suppressed. Thus, the liner 1204 will not form (i.e., will be absent from) the surfaces of the conductive element(s) 1014 in what is referred to herein as a 'self-aligning' process. By way of example only, eliminating the liner 1204 from the surfaces of the conductive element(s) 1014 will enable the formation of structures such as interconnects in the feature(s) 1102 that directly contact the conductive element(s) 1014, thereby vastly reducing overall contact resistance.

Figure 13:
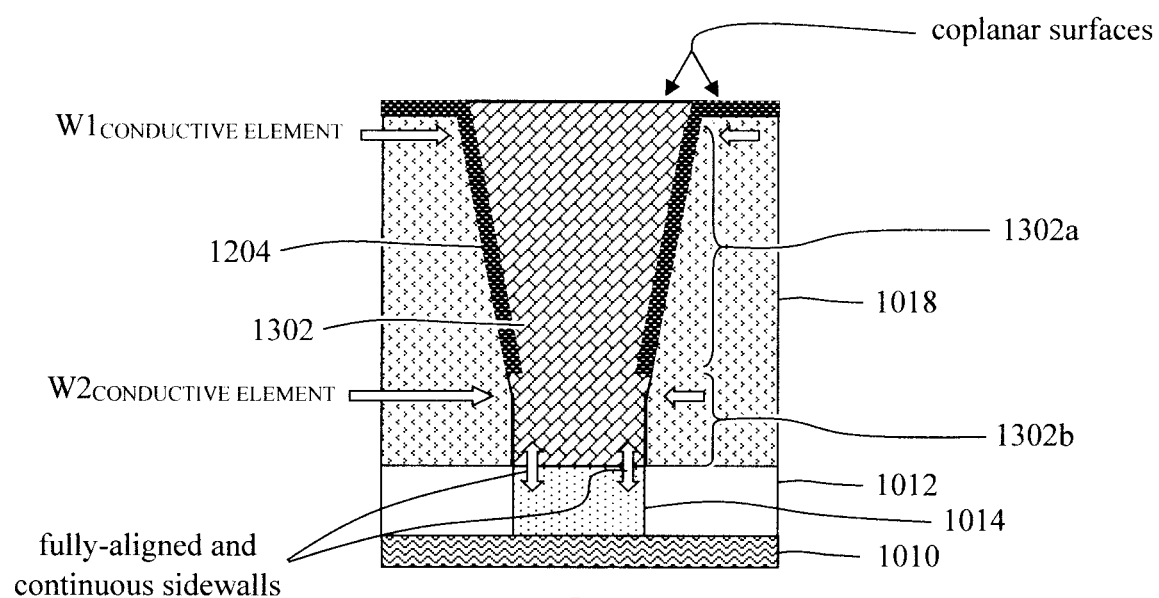
FIG. 13 is a diagram illustrating the second SAM(s) having been selectively removed, and a metal(s) having been deposited into the feature(s) over the liner to form at least one (second) conductive element in the second dielectric over the first conductive element(s) according to an embodiment of the present invention.

Namely, as shown in FIG. 13, the SAM(s) 1202 is then selectively removed, and a metal (or combinations of metals) is deposited into the feature(s) 1102 over the liner 1204 to form a conductive element(s) 1302 (such as an interconnect) in the dielectric 1018 over the conductive element(s) 1014. For clarity, the terms 'first' and 'second' may also be used herein when referring to the conductive element(s) 1014 and the conductive element(s) 1302.

An etch process such as RIE, a wet chemical etch, or a gas phase etch can be employed to selectively remove the SAM(s) 1202 from the feature(s) 1102. Suitable metals for the conductive element(s) 1302 include, but are not limited to, Cu, W, Co and/or Ru, which can be deposited into the feature(s) 1102 using a process such as evaporation, sputtering or electrochemical plating. Following deposition, the metal overburden can be removed using a process such as CMP or grinding. Advantageously, the liner 1204 serves as an etch stop during this metal removal process, thereby protecting the underlying dielectric 1018. According to an exemplary embodiment, a top surface of the conductive element(s) 1302 is now coplanar with a top surface of the liner 1204.

Since the (self-aligned) liner 1204 is not present on the conductive element(s) 1014, the conductive element(s) 1302 formed in this manner directly contacts the underlying conductive element(s) 1014. This direct metal-to-metal contact between the conductive element(s) 1014, and the conductive element(s) 1302 greatly reduces the contact resistance through these structures. Further, as shown in FIG. 13, the present process to place the liner 1204 results in a unique configuration where the liner 1204 partially covers the sidewall of the conductive element(s) 1302. Namely, the liner 1204 is present along only an upper portion 1302a of the conductive element(s) 1302 (i.e., separating the upper portion 1302a of the conductive element(s) 1302 from the dielectric 1018). The liner 1204 is absent from a lower portion 1302b of the conductive element(s) 1302 (i.e., such that the lower portion 1302b of the conductive element(s) 1302 directly contact the dielectric 1018).

Advantageously, the present process results in the formation of the conductive element(s) 1302 that are fully-aligned to the underlying conductive element(s) 1014. By 'fully-aligned' it is meant that, at a juncture of the conductive element(s) 1302 with the conductive element(s) 1014, both (opposing) sidewalls of the conductive element(s) 1302 are aligned with those of the conductive element(s) 1014. To look at it another way, the conductive element(s) 1302 and the conductive element(s) 1014 have a continuous sidewall. Thus, any problems associated with the misalignment of these structures (such as decreased contact area/increased contact resistance) are avoided altogether.

Based on the shape of the feature(s) 1102 in which it is formed, the conductive element(s) 1302 also has tapered sidewalls. Namely, as shown in FIG. 13, a top of the conductive element(s) 1302 has a width $W1_{CONDUCTIVE\ ELEMENT}$ and a bottom of the conductive element(s) 1302 has a width $W2_{CONDUCTIVE\ ELEMENT}$, whereby $W1_{CONDUCTIVE\ ELEMENT}$ is greater than $W2_{CONDUCTIVE\ ELEMENT}$, i.e., $W1_{CONDUCTIVE\ ELEMENT} > W2_{CONDUCTIVE\ ELEMENT}$. As compared to the conductive element(s) 902 (see FIG. 9) which has vertical sidewalls, by upwardly expanding the width of the conductive element(s) 1302 (via the tapered sidewalls), the size of the conductive element(s) 1302 can be increased which advantageously reduces overall resistance.

Figure 14:
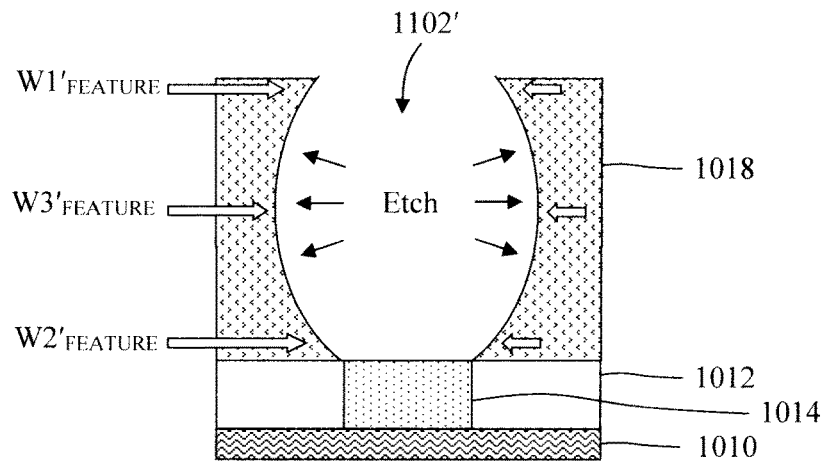
FIG. 14 is a diagram illustrating, according to another exemplary implementation of the present techniques which follows from FIG. 11, an etch having been performed to further contour the sidewalls of the feature(s) to created outwardly bowed sidewalls according to an embodiment of the present invention.
Figure 15:
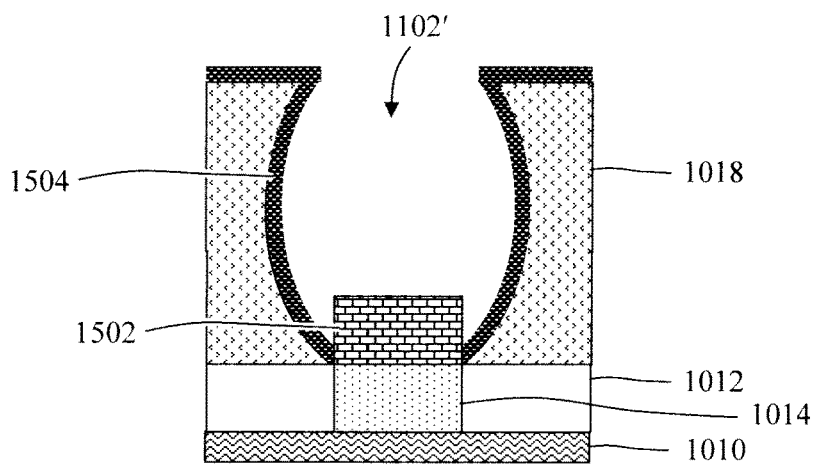
FIG. 15 is a diagram illustrating at least one second SAM having been selectively formed on the exposed surfaces of the first conductive element(s) within the feature(s), and a liner having been deposited onto the second dielectric and into, and lining, the feature(s) whereby the second SAM(s) suppresses growth of the liner on the second conductive element(s) according to an embodiment of the present invention.

Other shapes are also contemplated herein. For instance, an additional etch can be performed to further contour the sidewalls of the feature(s), creating a bowed shape. See, for example, FIGS. 14-16 which depict another exemplary methodology for forming a self-aligned semiconductor device structure with profile shaping in accordance with the present techniques. The process begins in the same manner as described in conjunction with the description of FIGS. 10 and 11 in the preceding example above, with the deposition of a dielectric 1012 on a substrate 1010, the formation of at least one conductive element 1014 (e.g., a metal line and/or a metal pad) in the dielectric 1012, the selective formation of at least one level of SAM 1016 on the exposed surfaces of the conductive element(s) 1014, the deposition of a dielectric 1018 over the dielectric 1012, the patterning of the dielectric 1018, and removal of the SAM(s) 1016 to reveal a feature(s) 1102 having tapered sidewalls. Thus, what is depicted in FIG. 14 follows from the structure shown in FIG. 11. Like structures are numbered alike in the figures. Advantageously, since the SAM(s) 1016 was selectively deposited onto the surfaces of the conductive element(s) 1014, the feature(s) 1102 formed by removal of the SAM(s) 1016 will be fully-aligned to the conductive element(s) 1014. Namely, as shown in FIG. 11, the feature(s) 1102 formed by this process cover an entire surface of the conductive element(s) 1014, and only the conductive element(s) 1014. To look at it another way, the feature(s) 1102 are not be present (i.e., the feature(s) 1102 are absent) over the dielectric 1012.

However, in this example, an etch is next performed to further contour the sidewalls of the feature(s) 1102. Namely, as shown in FIG. 14, the sidewalls of the feature(s) (now given the reference numeral 1102') are outwardly bowed following the contour etch. According to an exemplary embodiment, a non-directional (i.e., isotropic) etching process is employed for the contour etch which, as shown in FIG. 14, will expand the feature(s) 1102' out laterally. As a result, a top of the feature(s) 1102' has a width $W1'_{FEATURE}$, a bottom of the feature(s) 1102' has a width $W2'_{FEATURE}$, and a middle of the feature(s) 1102' has a width $W3'_{FEATURE}$ whereby $W3'_{FEATURE}$ is greater than both $W1'_{FEATURE}$ and $W2'_{FEATURE}$, i.e., $W3'_{FEATURE} > W1'_{FEATURE}$ and $W3'_{FEATURE} > W2'_{FEATURE}$.

According to an exemplary embodiment, the present techniques are employed to form MOL and/or BEOL semiconductor device structures such as interconnects. In that regard, the feature(s) 1102' can then simply be filled with a metal or combination of metals to form an interconnect(s) that is perfectly aligned with the conductive element(s) 1014. However, as described above, the dielectric 1018 is susceptible to damage during subsequent processing, including those steps involved in interconnect metallization.

Thus, according to an exemplary embodiment, a self-aligned liner is next formed in the feature(s) 1102' to protect the underlying dielectric 1018. To do so, at least one level of SAM 1502 is next selectively formed on the exposed surfaces of the conductive element(s) 1014 within the feature(s) 1102'. See FIG. 15. For clarity, the terms 'first' and 'second' may also be used herein when referring to SAM(s) 1016 and SAM(s) 1502, respectively. In the same manner as described above, the SAM(s) 1502 can include a single or multiple, vertically stacked, levels of SAM (any of which is generically represented by structure 1502 in the figures). As highlighted above, the SAM(s) 1502 is configured to bind selectively to the surfaces of the conductive element(s) 1014 and to suppress growth of the liner on the surfaces of the conductive element(s) 1014, thereby enabling the formation of a self-aligned liner. For instance, by way of example only, a SAM with a high carbon content will suppress growth of the liner on the surfaces of the conductive element(s) 1014. According to an exemplary embodiment, the SAM(s) 1502 is deposited onto the conductive element(s) 1014 in the feature(s) 1102 using a vapor phase deposition process (see above).

A liner 1504 is then deposited onto the dielectric 1018 and into, and lining, the feature(s) 1102'. As provided above, suitable liner materials include, but are not limited to, metal oxides such as $Al_2O_3$, ZnO and/or $TiO_2$, which can be deposited using a process such as CVD, ALD or PVD. According to an exemplary embodiment, the liner 1504 has a thickness of from about 1 nm to about 5 nm and ranges therebetween. Advantageously, due to the presence of the SAM(s) 1502 as an inhibitor on the conductive element(s) 1014 in the feature(s) 1102', growth of the liner 1504 on the conductive element(s) 1014 will be suppressed. Thus, the liner 1504 will not form (i.e., will be absent from) the surfaces of the conductive element(s) 1014 in what is referred to herein as a 'self-aligning' process. By way of example only, eliminating the liner 1504 from the surfaces of the conductive element(s) 1014 will enable the formation of structures such as interconnects in the feature(s) 1102' that directly contact the conductive element(s) 1014, thereby vastly reducing overall contact resistance.

Figure 16:
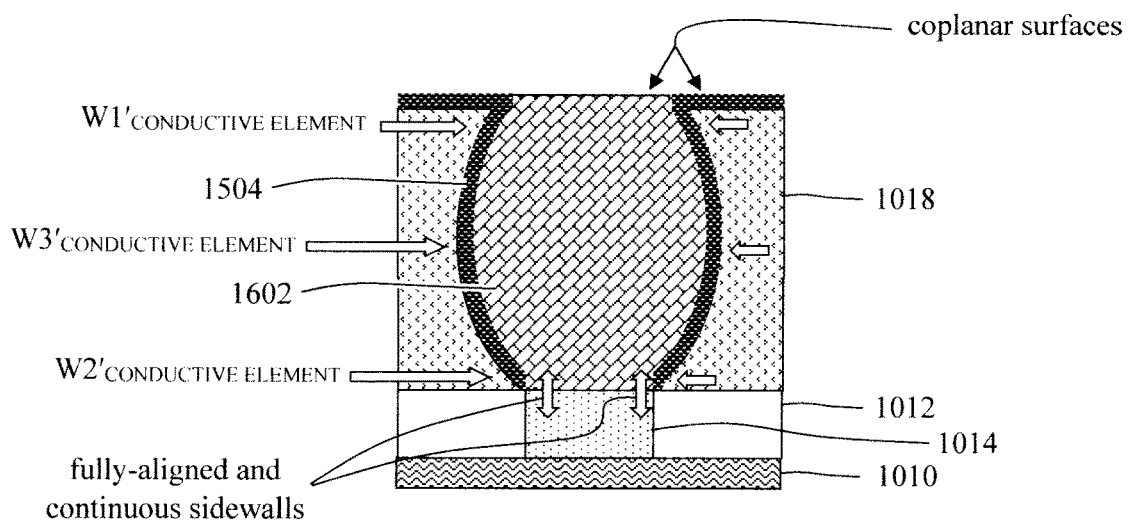
FIG. 16 is a diagram illustrating the second SAM(s) having been selectively removed, and a metal(s) having been deposited into the feature(s) over the liner to form at least one (second) conductive element in the second dielectric over the first conductive element(s) according to an embodiment of the present invention.

Namely, as shown in FIG. 16, the SAM(s) 1502 is then selectively removed, and a metal (or combinations of metals) is deposited into the feature(s) 1102' over the liner 1504 to form a conductive element(s) 1602 (such as an interconnect) in the dielectric 1018 over the conductive element(s) 1014. For clarity, the terms 'first' and 'second' may also be used herein when referring to the conductive element(s) 1014 and the conductive element(s) 1602.

An etch process such as RIE, a wet chemical etch, or a gas phase etch can be employed to selectively remove the SAM(s) 1502 from the feature(s) 1102'. Suitable metals for the conductive element(s) 1602 include, but are not limited to, Cu, W, Co and/or Ru, which can be deposited into the feature(s) 1102' using a process such as evaporation, sputtering or electrochemical plating. Following deposition, the metal overburden can be removed using a process such as CMP or grinding. Advantageously, the liner 1504 serves as an etch stop during this metal removal process, thereby protecting the underlying dielectric 1018. According to an exemplary embodiment, a top surface of the conductive element(s) 1602 is now coplanar with a top surface of the liner 1504.

Since the (self-aligned) liner 1504 is not present on the conductive element(s) 1014, the conductive element(s) 1602 formed in this manner directly contacts the underlying conductive element(s) 1014. This direct metal-to-metal contact between the conductive element(s) 1014, and the conductive element(s) 1602 greatly reduces the contact resistance through these structures.

Advantageously, the present process results in the formation of the conductive element(s) 1602 that are fully-aligned to the underlying conductive element(s) 1014. By 'fully-aligned' it is meant that, at a juncture of the conductive element(s) 1602 with the conductive element(s) 1014, both (opposing) sidewalls of the conductive element(s) 1602 are aligned with those of the conductive element(s) 1014. To look at it another way, the conductive element(s) 1602 and the conductive element(s) 1014 have a continuous sidewall. Thus, any problems associated with the misalignment of these structures (such as decreased contact area/increased contact resistance) are avoided altogether.

Based on the shape of the feature(s) 1102' in which it is formed, the conductive element(s) 1602 also has outwardly bowed sidewalls. Namely, as shown in FIG. 16, a top of the conductive element(s) 1602 has a width $W1_{CONDUCTIVE\ ELEMENT}$, a bottom of the conductive element(s) 1602 has a width $W2'_{CONDUCTIVE\ ELEMENT}$, and a middle of the conductive element(s) 1602 has a width $W3'_{CONDUCTIVE\ ELEMENT}$, whereby $W3'_{CONDUCTIVE\ ELEMENT}$ is greater than both $W1'_{CONDUCTIVE\ ELEMENT}$ and $W2'_{CONDUCTIVE\ ELEMENT}$, i.e., $W3'_{CONDUCTIVE\ ELEMENT} > W1'_{CONDUCTIVE\ ELEMENT}$ and $W3'_{CONDUCTIVE\ ELEMENT} > W2'_{CONDUCTIVE\ ELEMENT}$. As compared to the conductive element(s) 1302 (see FIG. 13) which has tapered sidewalls, by laterally expanding the width at the middle of the conductive element(s) 1602 (via the outwardly bowed sidewalls), the size of the conductive element(s) 1602 can be further increased which advantageously reduces overall resistance.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A structure, comprising:
   at least one first conductive element embedded in a first dielectric;
   a second dielectric disposed selectively on the first dielectric relative to the at least one first conductive element;
   at least one second conductive element present in the second dielectric that is fully aligned with the at least one first conductive element; and
   a liner disposed on the second dielectric, wherein the liner is present along a top surface of the second dielectric and along only an upper portion of sidewalls of the at least one second conductive element such that the liner separates the upper portion of the at least one second conductive element from the second dielectric.

2. The structure of claim 1, wherein, at a juncture of the at least one first conductive element and the at least one second conductive element, sidewalls of the at least one first conductive element are aligned with sidewalls of the at least one second conductive element.

3. The structure of claim 1, wherein the liner comprises a material selected from the group consisting of: aluminum oxide ($Al_2O_3$), zinc oxide (ZnO), titanium oxide ($TiO_2$), and combinations thereof.

4. The structure of claim 1, wherein the sidewalls of the at least one second conductive element are tapered such that a top of the at least one second conductive element has a width W1 and a bottom of the at least one second conductive element has a width W2, and wherein W1>W2.

5. The structure of claim 1, wherein the sidewalls of the at least one second conductive element are bowed such that a top of the at least one second conductive element has a width W1, a bottom of the at least one second conductive element has a width W2, and a middle of the at least one second conductive element has a width W3, wherein W3>W1, and wherein W3>W2.

6. The structure of claim 1, wherein the first dielectric and the second dielectric each comprises a material selected from the group consisting of: silicon oxide (SiOx), organosilicate glass (SiCOH), carbon-rich SiCN, SiCNO, porous organosilicate glass (pSiCOH), pSiCN, pSiCNO and combinations thereof.

7. The structure of claim 1, wherein the at least one first conductive element and the at least one second conductive element comprise a metal selected from the group consisting of: copper (Cu), tungsten (W), cobalt (Co), ruthenium (Ru), copper manganese (CuMn), copper aluminum (CuAl), and combinations thereof.

8. The structure of claim 1, wherein the at least one first conductive element directly contacts the at least one second conductive element.

* * * * *